(12) United States Patent
Song et al.

(10) Patent No.: US 8,294,503 B1
(45) Date of Patent: Oct. 23, 2012

(54) METHOD AND APPARATUS FOR REDUCING JITTER IN A TRANSMITTER

(75) Inventors: Yonghua Song, Saratoga, CA (US); Pantas Sutardja, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 1039 days.

(21) Appl. No.: 10/995,659

(22) Filed: Nov. 22, 2004

(51) Int. Cl.
H03H 11/26 (2006.01)

(52) U.S. Cl. .......................................... 327/284; 327/285

(58) Field of Classification Search .................. 327/261, 327/271, 277, 284, 285, 108, 112
See application file for complete search history.

(56) References Cited

U.S. PATENT DOCUMENTS

| | | | | | |
|---|---|---|---|---|---|
| 5,039,893 | A | * | 8/1991 | Tomisawa | 327/276 |
| 5,519,344 | A | * | 5/1996 | Proebsting | 327/108 |
| 5,777,501 | A | * | 7/1998 | AbouSeido | 327/274 |
| 5,917,762 | A | * | 6/1999 | Zheng et al. | 365/194 |
| 6,097,233 | A | * | 8/2000 | Schneider et al. | 327/281 |
| 6,229,364 | B1 | * | 5/2001 | Dortu et al. | 327/158 |
| 6,333,652 | B1 | * | 12/2001 | Iida et al. | 327/161 |
| 6,389,091 | B1 | * | 5/2002 | Yamaguchi et al. | 375/376 |
| 6,522,185 | B2 | * | 2/2003 | Helt et al. | 327/276 |
| 6,573,777 | B2 | * | 6/2003 | Saint-Laurent et al. | 327/276 |
| 6,859,082 | B2 | * | 2/2005 | Tang | 327/276 |
| 7,154,324 | B1 | * | 12/2006 | Maangat et al. | 327/288 |

OTHER PUBLICATIONS

IEEE Standard 802.20 Permanent Document; "*Mobile Broadband Wireless Access Systems—Version 14*"; Jul. 16, 2004; pp. 1-23.
IEEE Standard 802.11; "*Information Technology—Telecommunications and Information Exchange Between Systems—Local and Metropolitan Area Networks—Specific Requirements, Part II, Wireless LAN Medium Access Control (MAC) and Physical Layer (PHY) Specifications*"; 1999, pp. 1-531.
IEEE Standard 802.11g/D8.2, Draft Supplement, "*Information Technology—Telecommunications and Information Exchange Between Systems—Local and Metropolitan Area Networks—Specific Requirements, Part 11, Wireless LAN Medium Access Control (MAC) and Physical Layer (PHY) Specifications, Further Higher Data Rate Extension in the 2.4 GHz Band*"; 1999, pp. 1-69.
IEEE Standard 802.16; "*Local and Metropolitan Area Networks, Part 16: Air Interface for Fixed Broadband Wireless Access Systems*", 2004, pp. 1-893.
IEEE Standard 802.11A; Supplement to IEEE Standard for Information Technology, "*Telecommunications and Information Exchange Between Systems—Local and Metropolitan Area Networks—Specific Requirements—Part 11: Wireless LAN Medium Access Control (MAC) and Physical Layer (PHY) Specifications: High Speed Physical Layer in the 5GHZ Band*", 1999, pp. 1-91.
IEEE Standard 802.11b; "*Supplement to IEEE Standard for Information Technology—Telecommunications and Information Exchange Between Systems—Local Metropolitan Area Networks—Specification Requirements—Part 11: Wireless LAN Medium Access Control (MAC) and Physical Layer Extension in the 2.4 GHz Band*", 1999, pp. 1-96.

* cited by examiner

Primary Examiner — Hai L Nguyen

(57) ABSTRACT

A driver chain circuit and methods are provided. The driver chain circuit includes a plurality of voltage regulators and an inverter chain. The plurality of voltage regulators are operable to provide a bias to respective groups of one or more inverters within the inverter chain. The inverter chain includes a plurality of groups of one or more inverters. Each group of inverters is configured to receive a bias from a respective one of the plurality of voltage regulators.

37 Claims, 3 Drawing Sheets

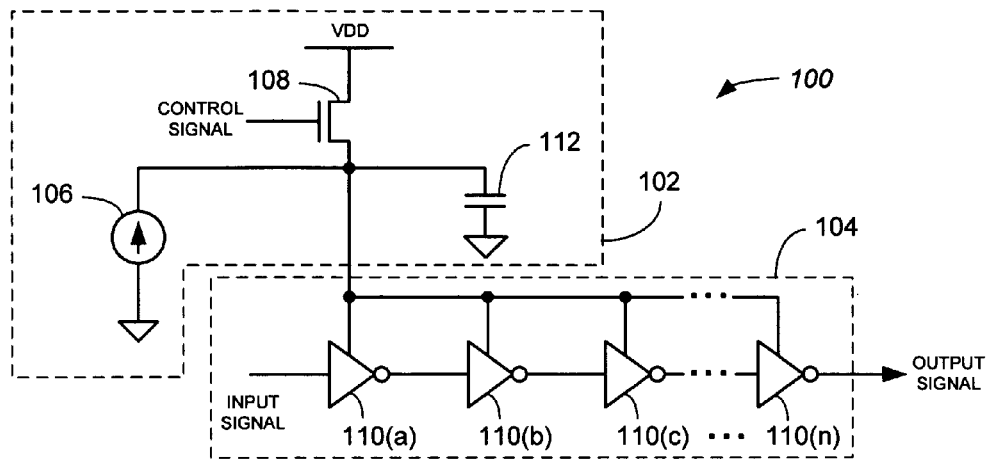
FIG._1 (PRIOR ART)
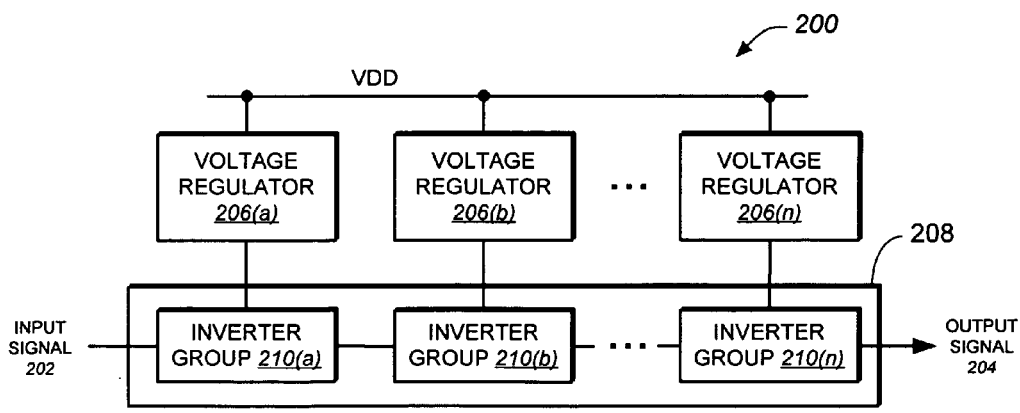
FIG._2

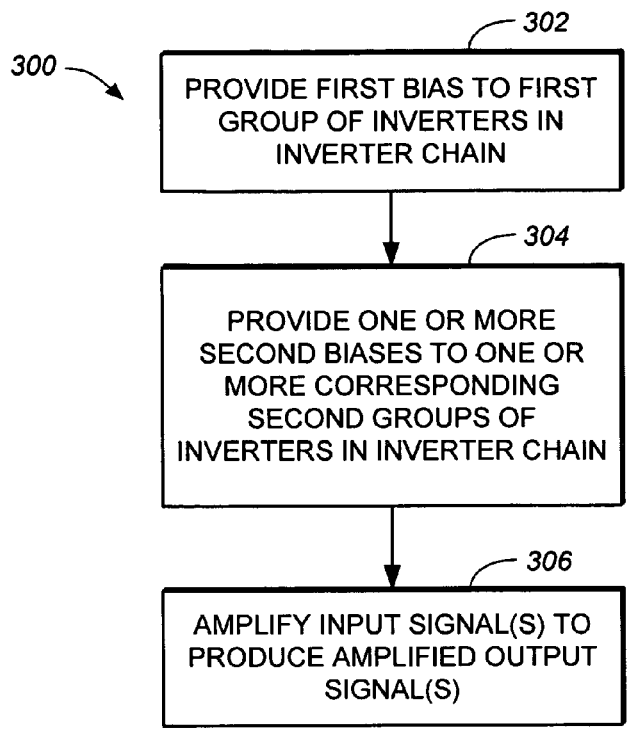
FIG._3
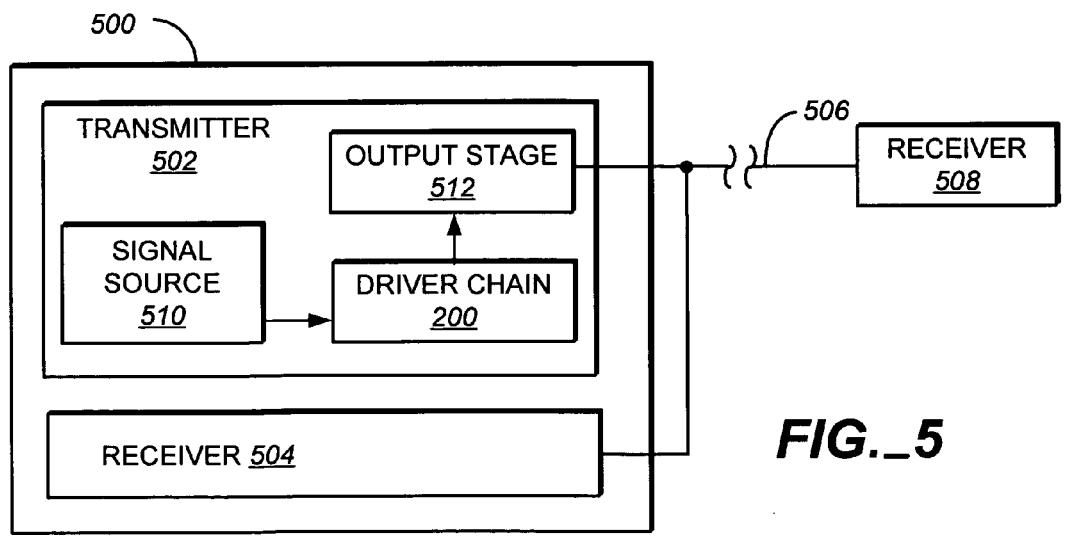
FIG._5

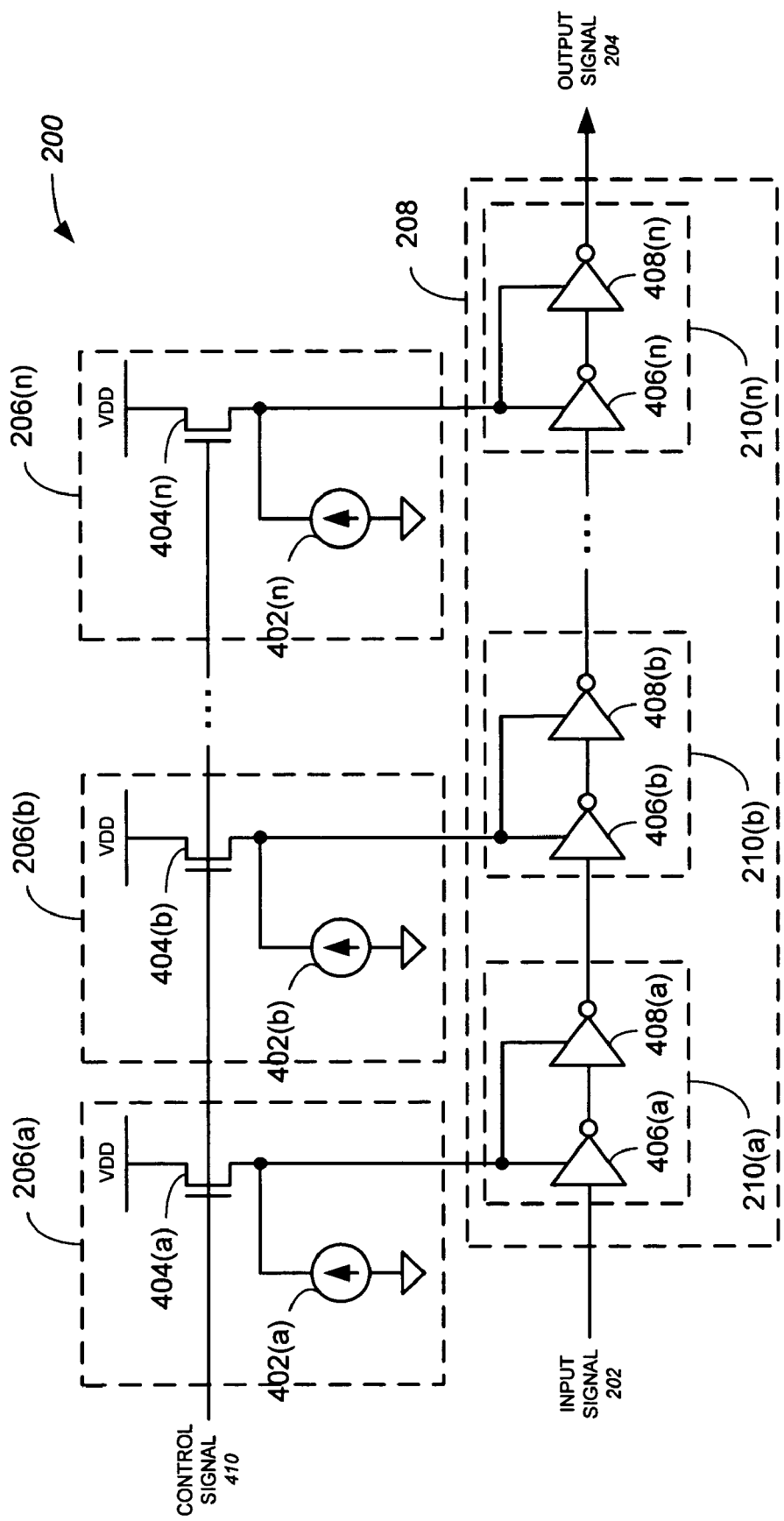
FIG._4

METHOD AND APPARATUS FOR REDUCING JITTER IN A TRANSMITTER

BACKGROUND

The following disclosure relates to electrical circuits and signal processing.

A transmitter (e.g., a transmitter in a data communication system) typically includes a driver chain, including multiple inverters (or buffers) that drive an input signal.

FIG. 1 shows a conventional driver chain 100 of a transmitter. Driver chain 100 includes a single voltage regulator 102 and an inverter chain 104. Voltage regulator 102 includes a bias current source 106 and a regulator 108. Inverter chain 104 includes (n) inverters 110(a)-110(n). Inverters 110(a)-110(n) can be progressively sized to optimize amplification of an input signal. Driver chain 100 can also include a decoupling capacitor 112. In general, voltage regulator 102 provides a stable bias (e.g., a bias voltage and/or bias current) to each of inverters 110(a)-110(n) and attenuates supply noise associated with a high-side supply voltage VDD through decoupling capacitor 112. A large capacitance value for decoupling capacitor 112 may cause a slow settling of high-side supply voltage VDD due to the memory effect of decoupling capacitor 112.

In a transmitter, one parameter that is generally controlled to within specified limits is jitter. Jitter represents a time difference between an ideal and an actual occurrence of an event. One type of jitter known as data-dependent jitter (or intersymbol interference (ISI)) is typically a result of bandwidth limitations of an associated driver chain (e.g., driver chain 100) in a given transmitter. Data-dependent jitter may be caused by a large, mutual coupling capacitance formed by multiple inverters of an inverter chain (e.g., inverter chain 104) being coupled through a shared inverter supply.

SUMMARY

In general, in one aspect, this specification describes a transmitter including a signal source, a driver chain, and an output stage. The signal source is operable to provide a signal to be transmitted by the transmitter. The driver chain includes a plurality of voltage regulators and an inverter chain. The plurality of voltage regulators are operable to provide a bias to respective groups of one or more inverters within the inverter chain. The inverter chain includes a plurality of groups of one or more inverters. Each group of inverters is configured to receive a bias from a respective one of the plurality of voltage regulators. The inverter chain is operable to amplify the signal provided by the signal source and generate an amplified output signal. The output stage is operable to transmit the amplified output signal from the transmitter.

Particular implementations may include one or more of the following features. Each voltage regulator can include a current source operable to provide a bias current. Each voltage regulator can further include a regulator operable to control an amount of bias current being provided to each group of one or more inverters. Each regulator can include one or more transistors sized to match a current draw required for each respective group of one or more inverters. Inverters within the inverter chain can be progressively sized such that inverters that are closer to an output of the inverter chain include one or more transistors having a larger size relative to one or more transistors of inverters closer to an input of the inverter chain. Each of the groups of one or more inverters can contain a same amount of inverters. A first group of the groups of one or more inverters can include a different amount of inverters relative to one or more second groups of the groups of one or more inverters. The signal can be a data signal or a clock signal.

In general, in another aspect, this specification describes a transceiver including a transmitter as described above. Particular implementations may include one or more of the following features. The transceiver can operate at a data rate greater than or equal to 1.25 Gb/s. The transceiver can be IEEE 1000Base-TX compliant. The transceiver can also be compliant with one or more of the following IEEE wireless communication protocols: 802.11, 802.11a, 802.11b, 802.11g, 802.11n, 802.16 and 802.20.

In general, in another aspect, this specification describes a method including providing a first bias to a first group of inverters within an inverter chain, the inverter chain processing an input signal; providing one or more second biases to one or more corresponding second groups of inverters within the inverter chain; and producing an output signal having a low jitter characteristic relative to a level of the output signal.

In general, in another aspect, this specification describes a driver chain. The driver chain includes a plurality of voltage regulators and an inverter chain. The plurality of voltage regulators are operable to provide a bias to respective groups of one or more inverters within the inverter chain. The inverter chain includes a plurality of groups of one or more inverters. Each group of inverters is configured to receive a bias from a respective one of the plurality of voltage regulators. The inverter chain is operable to amplify an input signal and generate an amplified output signal.

Implementations can include one or more of the following advantages. A method and apparatus is provided for reducing jitter in a transmitter (e.g., a 1.25-2.5 Gb/s high speed transmitter). A driver chain of the transmitter includes a plurality of voltage regulators that supply a bias to respective groups of inverters within an inverter chain. Reducing the number of inverters coupled to a voltage regulator can reduce a coupling capacitance between the inverters, and therefore reduce jitter in signals being transmitted by the transmitter.

The details of one or more implementations are set forth in the accompanying drawings and the description below. Other features and advantages will be apparent from the description and drawings, and from the claims.

DESCRIPTION OF DRAWINGS

FIG. 1 is a schematic diagram of a conventional driver chain of a transmitter.

FIG. 2 is block diagram of a driver chain of a transmitter.

FIG. 3 is a flowchart illustrating operation of the driver chain of FIG. 2.

FIG. 4 is a schematic diagram of a driver chain of a transmitter.

FIG. 5 is a block diagram of a transceiver system.

Like reference symbols in the various drawings indicate like elements.

DETAILED DESCRIPTION

FIG. 2 illustrates a block diagram of a driver chain 200 of a transmitter including multiple voltage regulators, in which each voltage regulator supplies a bias to a corresponding group of one or more inverters or buffers. The groups of one or more inverters or buffers form driver chain 200. Input signal 202 can include any type of signal, for example, data signals, clock signals, and so on. In one implementation, driver chain 200 includes a plurality of voltage regulators 206(a)-206(n) and an inverter chain 208. Inverter chain 208 includes a plurality inverters (not shown) that are grouped into inverter groups 210(a)-210(n). An inverter group is a group of one or more inverters.

Voltage regulator 206(a) is in communication with inverter group 210(a), voltage regulator 206(b) is in communication with inverter group 210(b), and voltage regulator 206(n) is in communication with inverter group 210(n). Each voltage regulator 210(a)-210(n) is also in communication with a power supply VDD. An input of inverter group 210(a) is in communication with input signal 202 and an output of inverter group 210(a) is in communication with an input of inverter group 210(b). An output of inverter group 210(b) is in communication with an input inverter group 210(n). An output of inverter group 210(n) represents output signal 204.

Voltage regulator 206(a) includes circuitry for providing a bias (e.g., a bias voltage and/or bias current) to each of the inverters (not shown) within inverter group 210(a). Likewise, voltage regulator 206(b) provides a bias to each of the inverters (not shown) within inverter group 210(b) and voltage regulator 206(n) provides a bias to each of the inverters (not shown) within inverter group 210(n). Unlike a conventional driver chain that may include only one voltage regulator, driver chain 200 includes a plurality of voltage regulators (e.g., voltage regulators 206(a)-206(n)) that are operable to provide a bias to respective groups of inverters (e.g., inverter groups 210(a)-210(n)) within an inverter chain (e.g., inverter chain 208). In general, voltage regulators 206(a)-206(n) suppress supply noise associated with high-side supply VDD to reduce signal jitter impact from the supply noise.

In one implementation, each inverter group 210(a)-210(n) contains a same number of inverters. Alternatively, one or more inverter groups can include a different number of inverters relative to one or more other inverter groups—e.g., inverter group 210(a) can include (3) inverters, inverter group 210(b) can include (2) inverters, and inverter group 210(n) can include (1) inverter. In one implementation, the inverters within inverter chain 208 are progressively sized. For example, the inverters closer to output signal 204 can include transistors having a larger size (or width/length ratio) relative to inverters closer to input signal 202.

FIG. 3 shows a method 300 for providing a bias (e.g., a bias voltage and/or bias current) to an inverter chain (e.g., inverter chain 208 of FIG. 2). Referring to FIGS. 2 and 3, a first bias is provided to a first group of inverters (e.g., inverter group 210(a)) within an inverter chain (e.g., inverter chain 208) (step 302). One or more second biases are provided to one or more corresponding second groups of inverters (e.g., inverter groups 210(b)-210(n)) in the inverter chain (step 304). As discussed above, the inverter groups can contain a same or a different number of inverters. The inverter chain produces an output signal (e.g., output signal 204) having a low jitter characteristic (step 306).

FIG. 4 shows one implementation of driver chain 200, including voltage regulators 206(a)-206(n) and inverter chain 208. Voltage regulator 206(a) includes a current source 402(a) and a regulator 404(a). Voltage regulator 206(b) includes a current source 402(b) and a regulator 404(b). Voltage regulator 206(n) includes a current source 402(n) and a regulator 404(n). In the implementation of FIG. 4, inverter chain 208 includes (n) inverter groups 210(a)-210(n) in which each inverter group 210(a)-210(n) contains only (2) inverters. Inverter group 210(a) contains inverters 406(a), 408(a). Inverter group 210(b) contains inverters 406(b), 408(b). Inverter group 210(n) contains inverters 406(n), 408(n).

In operation, voltage regulator 206(a) provides a bias (e.g., a bias voltage and/or bias current) to inverter group 210(a), voltage regulator 206(b) provides a bias to inverter group 210(b), and voltage regulator 206(n) provides a bias to inverter group 210(n). Voltage regulators 206(a)-206(n) are controlled to supply the bias to respective inverter groups 210(a)-210(n) by a control signal 410. In one implementation, regulators 404(a)-404(n) are progressively sized to match a current draw required for each respective inverter group 210(a)-210(n). For example, regulator 404(n) can include one or more transistors having a larger size (e.g., W/L ratio) relative to one or more transistors of regulator 404(b).

FIG. 5 illustrates a block diagram of a transceiver system 500. In one implementation, transceiver system 500 is serial ATA (Advanced Technology Attachment) compliant. Transceiver system 500 can also be compliant with other IEEE standards, e.g., IEEE XAUI (2.5/3.125 Gb/s), IEEE 1000Base-TX, fiber channel, PCI Express, and so on. Transceiver system 500 can also be compliant with one or more wireless communication protocols. In one implementation, transceiver system 500 includes a transmitter 502, a receiver 504, and a transmission channel 506. Transmission channel 506 passes signals (e.g., data signals, clock signals, and so on) from transmitter 502 to a far-side receiver 508. Transmission channel 506 can include any type of wire line channel, for example, a single-ended transmission wire line or a pair of differential transmission wire lines (e.g., a Cat-5 twisted pair cable, optical fiber, printed circuit board (PCB) transmission line, and so on). Transmission channel 506 can also be a wireless transmission channel. Transmitter 502 includes a signal source 510, driver chain 200 and an output stage 512. Output stage 512 can include an output transistor (not shown). Driver chain 200 processes signals from signal source 510 and passes the processed signals to output stage 512 for transmission to far-side receiver 508. Driver chain 200 can be configured to include a plurality of voltage regulators that are operable to supply a bias (e.g., a bias voltage and/or bias current) to respective groups of one or more inverters within an inverter chain that processes the signals from signal source 510.

A number of implementations have been described. Nevertheless, it will be understood that various modifications may be made without departing from the spirit and scope of the invention. For example, the step of methods described above may be performed in a different order and still achieve desirable results. Accordingly, other implementations are within the scope of the following claims.

What is claimed is:

1. A transmitter comprising:
   a signal source operable to provide a signal to be transmitted by the transmitter;
   a driver chain including,
      a plurality of voltage regulators, each voltage regulator associated with a different bias source operable to provide a bias current to a different inverter group within an inverter chain to perform signal amplification, wherein each voltage regulator includes a current source as the bias source and operable to provide the bias current; and
      the inverter chain including a plurality of inverter groups, each inverter group having one or more inverters and configured to receive the bias current from the different bias source of a corresponding voltage regulator, the inverter chain operable to amplify the signal provided by the signal source and generate an amplified output signal; and
   an output stage operable to transmit the amplified output signal from the transmitter.

2. The transmitter of claim 1, wherein each voltage regulator further includes a regulator different from regulators of other voltage regulators, the regulator operable to control an amount of the bias current being provided to each of the plurality of inverter groups.

3. The transmitter of claim 2, wherein each regulator comprises one or more transistors sized to match a current draw required for each respective inverter group.

4. The transmitter of claim 1, wherein inverters within the inverter groups of the inverter chain are progressively sized such that inverters that are closer to an output of the inverter chain comprise one or more transistors having a larger size relative to one or more transistors of inverters that are closer to an input of the inverter chain.

5. The transmitter of claim 1, wherein each of the plurality of inverter groups contains a same amount of inverters.

6. The transmitter of claim 1, wherein a first inverter group of the plurality of inverter groups includes a different amount of inverters relative to one or more second groups of the plurality of inverter groups.

7. The transmitter of claim 1, wherein the signal is one of a data signal or a clock signal.

8. The transmitter of claim 1, further comprising a receiver for receiving the amplified output signal.

9. The transmitter of claim 8, wherein the transmitter and receiver operate at a data rate greater than or equal to 1.25 Gb/s.

10. The transmitter of claim 8, wherein the transmitter and receiver are IEEE 1000Base-TX compliant.

11. The transmitter of claim 8, wherein the transmitter and receiver are compliant with one or more of the following IEEE wireless communication protocols: 802.11, 802.11a, 802.11b, 802.11g, 802.11n, 802.16 and 802.20.

12. A driver chain comprising:
a plurality of voltage regulators, each voltage regulator associated with a different bias source operable to provide a bias current to a different inverter group within an inverter chain to perform signal amplification, wherein each voltage regulator includes a current source as the bias source and operable to provide the bias current; and
the inverter chain including a plurality of inverter groups, each inverter group having one or more inverters and configured to receive the bias current from the different bias source of a corresponding voltage regulator, the inverter chain operable to amplify an input signal and generate an amplified output signal.

13. The driver chain of claim 12, wherein each voltage regulator further includes a regulator different from regulators of other voltage regulators, the regulator operable to control an amount of the bias current being provided to each of the plurality of inverter groups.

14. The driver chain of claim 13, wherein each regulator comprises one or more transistors sized to match a current draw required for each respective inverter group.

15. The driver chain of claim 12, wherein inverters within the inverter groups of the inverter chain are progressively sized such that inverters that are closer to an output of the inverter chain comprise one or more transistors having a larger size relative to one or more transistors of inverters that are closer to an input of the inverter chain.

16. The driver chain of claim 12, wherein each of the plurality of inverter groups contains a same amount of inverters.

17. The driver chain of claim 12, wherein a first inverter group of the plurality of inverter groups includes a different amount of inverters relative to one or more second groups of the plurality of inverter groups.

18. The driver chain of claim 12, wherein the signal is one of a data signal or a clock signal.

19. A transmitter comprising:
means for providing a source signal to be transmitted by the transmitter;
means for driving the source signal including,
a plurality of voltage regulating means each associated with a different bias means for providing a bias current to a different inverter group within an inverter chain means for perform signal amplification, wherein each of the different bias means for providing a bias current includes a current source as the bias means and operable to provide the bias current; and
the inverter chain means including a plurality of inverter groups, each inverter group having one or more means for inverting and receiving the bias current from the different bias means for providing the bias current, the inverter chain means for processing the source signal and generating an output signal; and
means for transmitting the output signal from the transmitter.

20. The transmitter of claim 19, wherein each means for providing a bias current further includes different means for controlling an amount of the bias current being provided to each inverter group.

21. The transmitter of claim 20, wherein each means for controlling an amount of the bias current being provided to each inverter group comprises one or more transistor means sized to match a current draw required for each respective inverter group.

22. The transmitter of claim 19, wherein means for inverting within the inverter groups of the inverter chain means are progressively sized such that means for inverting that are closer to an output of the inverter chain means comprise one or more transistor means having a larger size relative to one or more transistor means of means for inverting that are closer to an input of the inverter chain means.

23. The transmitter of claim 19, wherein each of the inverter groups contains a same amount of means for inverting.

24. The transmitter of claim 19, wherein a first inverter group of the plurality of inverter groups includes a different amount of means for inverting relative to one or more second groups of the inverter groups.

25. The transmitter of claim 19, wherein the signal is one of a data signal or a clock signal.

26. The transmitter of claim 19, further comprising a receiver for receiving the output signal.

27. The transmitter of claim 26, wherein the transmitter and receiver operate at a data rate greater than or equal to 1.25 Gb/s.

28. The transmitter of claim 26, wherein the transmitter and receiver are serial ATA (Advanced Technology Attachment) compliant.

29. A driver chain comprising:
a plurality of voltage regulating means each associated with a different bias means for providing a bias current to a different inverter group within an inverter chain means for perform signal amplification, wherein each of the different means for providing a bias current includes a current source as the bias means and operable to provide the bias current; and
the inverter chain means including a plurality of inverter groups, each inverter group having one or more means for inverting and receiving the bias current from the different bias means for providing the bias current, the inverter chain means for processing an input signal source and generating an output signal.

30. The driver chain of claim 29, wherein each means for providing a bias current further includes different means for controlling an amount of the bias current being provided to each inverter group.

31. The driver chain of claim 30, wherein each means for controlling an amount of the bias current being provided to each inverter group comprises one or more transistor means sized to match a current draw required for each respective inverter group.

32. The driver chain of claim 29, wherein means for inverting within the inverter groups of the inverter chain means are progressively sized such that means for inverting that are closer to an output of the inverter chain means comprise one or more transistor means having a larger size relative to one or more transistor means of means for inverting that are closer to an input of the inverter chain means.

33. The driver chain of claim 29, wherein each of the inverter groups contains a same amount of means for inverting.

34. The driver chain of claim 29, wherein a first inverter group of the plurality of inverter groups includes a different amount of means for inverting relative to one or more second groups of the inverter groups.

35. The driver chain of claim 29, wherein the signal is one of a data signal or a clock signal.

36. A method comprising:
providing, using a first bias source, a first bias to a first group of inverters within an inverter chain, the inverter chain processing an input signal;
providing, using a second bias source, one or more second biases to one or more corresponding second groups of inverters within the inverter chain, each of the one or more corresponding second groups being different from the first group; and
producing an amplified output signal having a low jitter characteristic relative to a level of the output signal;
wherein providing a first bias includes providing a first bias current from the first bias source that includes a first current source, and wherein providing one or more second biases includes providing one or more second bias currents from the second bias source that includes one or more corresponding second current sources, the one or more corresponding second current sources being different from the first current source.

37. The method of claim 36, further comprising controlling an amount of the bias current being provided to each of the first group and the one or more corresponding second groups.

* * * * *